United States Patent [19]

Merrill et al.

[11] Patent Number: 5,397,934
[45] Date of Patent: Mar. 14, 1995

[54] APPARATUS AND METHOD FOR ADJUSTING THE THRESHOLD VOLTAGE OF MOS TRANSISTORS

[75] Inventors: Richard B. Merrill, Daly City; Doug R. Farrenkopf, Santa Clara, both of Calif.

[73] Assignee: National Semiconductor Corporation, Santa Clara, Calif.

[21] Appl. No.: 42,725

[22] Filed: Apr. 5, 1993

[51] Int. Cl.⁶ .......................... H03K 3/01; H03L 1/00
[52] U.S. Cl. .................................. 327/537; 327/534; 327/546
[58] Field of Search ............... 307/296.2, 296.4, 296.8, 307/296.5

[56] References Cited

U.S. PATENT DOCUMENTS

| | | | |
|---|---|---|---|
| 4,142,114 | 2/1979 | Green | 307/296.2 |
| 4,471,290 | 9/1984 | Yamaguchi | 307/296.2 |
| 5,150,188 | 9/1992 | Hara et al. | 307/296.8 |

OTHER PUBLICATIONS

Takashi Hori, "¼ μm Large-Tilt-Angle Implanted Drain (LATID) Device Technology", National Technical Report (Matsushita Electric Industry Co.), vol. 36, No. 4, pp. 84–89, Aug. 1990.

M. J. Deen & Jing Wang, "Design Considerations for the Operation of CMOS Inverters at Cryogenic Temperatures", Proceedings of the Symposium on Low Temperature Electronics and High Temperature Superconductors, Oct. 19–23, 1987, Electrochem. Soc., pp. 108–116, 1989.

D. E. DeBar, "Dynamic Substrate Bias to Achieve Radiation Hardening", vol. 25, No. 11A, Apr. 1983 pp. 5829–5830.

G. C. Luckett, "Substrate Voltage Generator with Compensation for Depletion-Mode and Enhancement-mode Field-Effect Transistors", Dec. 1981, pp. 3537–3538.

P. Pleshko et al, "MOS Transistor Electronic Stabilization of Thresholds," vol. 10, No. 3 Aug. 1967 pp. 336–337.

Primary Examiner—Timothy P. Callahan
Assistant Examiner—Terry L. Englund
Attorney, Agent, or Firm—Limbach & Limbach

[57] ABSTRACT

An apparatus and method for adjusting the effective threshold voltage of a MOS transistor is disclosed. Reference voltage generation circuitry is used for generating a first voltage signal. Threshold voltage monitoring circuitry that includes the MOS transistor is used for measuring the effective threshold voltage of the MOS transistor and for generating a second voltage signal. Feedback circuitry compares the first voltage signal to the second voltage signal and adjusts the effective threshold voltage of the MOS transistor so that the first voltage signal is substantially equal to the second voltage signal. The effective threshold voltage of the MOS transistor is adjusted by adjusting its source-body voltage potential. The method includes the steps of generating a first voltage signal, measuring the effective threshold voltage of the MOS transistor, generating a second voltage signal, comparing the first voltage signal to the second voltage signal, and adjusting the effective threshold voltage of the MOS transistor so that the second voltage signal is substantially equal to the first voltage signal.

39 Claims, 5 Drawing Sheets

APPARATUS AND METHOD FOR ADJUSTING THE THRESHOLD VOLTAGE OF MOS TRANSISTORS

BACKGROUND OF THE INVENTION

1. Field of the Invention

The present invention relates to metal-oxide semiconductor (MOS) transistors, and more particularly, to an apparatus and method for adjusting the threshold voltage of MOS transistors.

2. Description of the Related Art

A metal-oxide semiconductor field-effect transistor (MOSFET) utilizes a thin dielectric barrier to isolate the gate and channel. A control voltage applied to the gate terminal induces an electric field across the dielectric barrier and modulates the free-carrier concentration in the channel region. MOS transistors are classified as either p-channel or n-channel devices, depending on the conductivity type of the channel region.

MOS transistors are also classified according to their mode of operation. In a depletion-mode MOS transistor, a conducting channel exists under the gate with no applied gate voltage. The applied gate voltage controls the current flow between the source and the drain by "depleting" or narrowing, a part of the channel.

In an enhancement-mode MOS transistor, no conductive channel exists between the source and the drain at zero applied gate voltage. As a gate-source bias of proper polarity is applied and increased beyond a threshold voltage $V_T$, a localized inversion layer is formed directly below the gate. This layer serves as a conducting channel between the source and the drain. If the gate-source bias is increased further, the resistivity of the induced channel is reduced, and the current conduction between the source and the drain is enhanced.

In an n-channel enhancement-mode MOS transistor, the gate-source voltage $V_{GS}$ must be positive in order to induce a channel. Because no current can flow until the channel is formed, current will flow only when $v_{GS}$ exceeds a positive $V_T$. In a p-channel enhancement-mode MOS transistor, the gate-source voltage $v_{GS}$ must be negative in order to induce a channel. Current will flow only when $V_{GS}$ falls below a negative $V_T$, or, in other words, when $V_{SG}$ exceeds a positive $V_T$.

The value of the threshold voltage $V_T$ of a MOS transistor is determined in part by the fabrication process specifications, i.e., the channel length, channel width, doping, etc. Thus, $V_T$ can be set to a desired level during fabrication.

In an integrated circuit that may contain many thousands of MOS transistors, various circuitry is employed to vary the gate-source voltage $V_{GS}$ of each transistor in order to switch the transistor on and off. Generally, $V_{GS}$ is increased above $V_T$ to switch the transistor on and decreased below $V_T$ to switch the transistor off. The circuitry used to vary the $v_{GS}$ of the individual transistors is configured to operate with predetermined supply voltages that are supplied to the integrated circuit.

Although conventional MOS transistors have functioned adequately in thousands of integrated circuit applications, there are currently at least two problems associated with threshold voltage $V_T$ selection which have contributed to the inefficiency of MOS transistors.

The first problem associated with $V_T$ selection relates to the predetermined supply voltages. Due to varying loads placed on voltage supplies and inconsistencies in various voltage supplies, it is not uncommon for a predetermined supply voltage that is supposed to be 3.3 Volts to be as low as 2 Volts or as high as 5 Volts. Thus, the $V_T$ of the transistors must be chosen so that the transistors will be operable with a voltage supply falling in the range of 2 to 5 Volts.

It is difficult, however, to choose the $V_T$ such that the transistor will operate efficiently in such a wide supply voltage range. For example, if $V_T$ of the transistors is chosen low for optimal performance when the supply voltage is 2 Volts, then a supply voltage of 5 Volts will cause $v_{GS}$ to increase too far above $V_T$. Because the chosen $V_T$ may be too low for operation with a 5 Volt supply, $V_{GS}$ may be close or even equal to $V_T$ when the transistor is supposed to be switched off. Thus, if $V_T$ is too low, then the transistor might be slightly on resulting in current leakage when it is supposed to be in the off state.

On the other hand, if the $V_T$ of the transistors is chosen high for optimal performance (i.e., low leakage in the off state) when the supply voltage is 5 Volts, then a supply voltage of only 2 Volts will decrease the amount of "headroom" available in the operating range of the transistor. Specifically, the term "headroom" as used herein is intended to refer to the difference between the supply voltage and $V_T$. If the chosen $V_T$ is too high, then the headroom is decreased which is undesirable because there is less of a guarantee that $v_{GS}$ will go far enough above $V_T$ to fully switch the transistor on. Indeed, it is possible that $V_{GS}$ may not even reach $V_T$ in which case the transistor would not be capable of switching on.

The second problem associated with threshold voltage selection relates to the fabrication process of MOS transistors. The channel length, channel width, gate oxide thickness, doping, etc., all play a part in determining $V_T$. Although modern fabrication techniques permit $V_T$ to be defined fairly accurately, inconsistencies in the fabrication process nevertheless cause $V_T$ variations among the individual transistors.

Even if the supply voltage does not vary from its specified value, if $V_T$ cannot be accurately set, the same problems of current leakage or decreased headroom can occur. In other words, if $V_T$ comes out at the low end of the specifications, then current leakage may be a problem. On the other hand, if $V_T$ comes out at the high end of the specifications, then the headroom is decreased.

Conventional solutions to the inability to accurately control $V_T$ include choosing an extra large channel length L so that when $V_T$ comes out at the low end of the specifications, perhaps due to doping variations, current leakage remains within the specifications. However, this solution suffers from the disadvantage that, when an extra large channel length is used, the average drive current must be kept low in order to control current leakage. It is more desirable to have a higher average drive current.

It is becoming increasingly more desirable to use lower supply voltages with MOS transistors in order to conserve power. As supply voltages decrease, accurate control over the exact value of $V_T$ becomes more important. Accurate control over the value of $V_T$ is important because less headroom is available. Furthermore, if $V_T$ can be accurately controlled, then the transistor can be fabricated with process specifications that permit it to tolerate a higher average drive current.

Therefore, an apparatus and/or method is needed that will solve the problems associated with MOS transistor threshold voltage $V_T$ selection.

SUMMARY OF THE INVENTION

The present invention provides an apparatus for adjusting the effective threshold voltage of a MOS transistor. Reference voltage generation circuitry is used for generating a first voltage signal. Threshold voltage monitoring circuitry that includes the MOS transistor is used for measuring the effective threshold voltage of the MOS transistor and for generating a second voltage signal. Feedback circuitry compares the first voltage signal to the second voltage signal and adjusts the effective threshold voltage of the MOS transistor so that the first voltage signal is substantially equal to the second voltage signal.

The present invention also provides methods of adjusting the effective threshold voltage of a MOS transistor to a desired effective threshold voltage. In accordance with a first method, which may be used to adjust the effective threshold voltage of an n-channel MOS transistor, a first voltage signal having a voltage approximately equal to the desired effective threshold voltage is generated. Then the effective threshold voltage of the MOS transistor is measured. A second voltage signal having a voltage approximately equal to the measured effective threshold voltage of the MOS transistor is then generated. The first voltage signal is compared to the second voltage signal, and the effective threshold voltage of the MOS transistor is adjusted so that the second voltage signal is substantially equal to the first voltage signal.

In accordance with a second method, which may be used to adjust the effective threshold voltage of a p-channel MOS transistor, is similar to the first method except that the first voltage signal has a voltage approximately equal to the difference between a supply voltage and the desired effective threshold voltage, and the second voltage signal has a voltage approximately equal to the difference between the supply voltage and the measured effective threshold voltage of the MOS transistor.

A better understanding of the features and advantages of the present invention will be obtained by reference to the following detailed description of the invention and accompanying drawings which set forth an illustrative embodiment in which the principles of the invention are utilized.

DETAILED DESCRIPTION OF THE PREFERRED EMBODIMENT

The present invention overcomes the two problems associated with threshold voltage $V_T$ selection discussed above by providing an apparatus and method for adjusting a variable referred to herein as the "effective threshold voltage $V_{Teff}$" of a MOS transistor. The meaning of the terms "threshold voltage" and "effective threshold voltage" as used herein are slightly different.

The term "threshold voltage $V_T$" as used herein is intended to refer to the transistor gate-source voltage $V_{GS}$ at which current begins to flow between the drain and source when the transistor "body" is tied to the same potential as the source. Specifically, the bulk of the semiconductor region of a MOS transistor is normally inactive because current flow is confined to the thin surface channel directly below the gate. This part of the transistor is called the "body" and is often tied to the same potential as the source. When the body is tied to the same potential as the source, the source-body voltage $v_{SB}=0$ Volts. In this scenario, i.e., where the body is tied to the same potential as the source, the value of $V_T$ is determined primarily by the fabrication process specifications discussed above.

However, by varying the potential applied to the body of the transistor (i.e., by varying the source-body voltage $V_{SB}$), the gate-source voltage $V_{GS}$ at which current begins to flow between the drain and source can be further adjusted, even though the "threshold voltage $V_T$" has already been determined by the fabrication process specifications. As used herein, the term "effective threshold voltage $V_{Teff}$" is intended to refer to the $V_{GS}$ at which approximately 1.0 micro-ampere of current flows between the drain and source for any given value of source-body voltage $V_{SB}$.

Therefore, the effective threshold voltage $V_{Teff}$ of a transistor may be adjusted by varying the potential applied to the body. In an n-channel MOS transistor, a positive $V_{SB}$ increases the $V_{Teff}$, and a negative $V_{SB}$ decreases the $V_{Teff}$. In a p-channel MOS transistor, a positive $V_{SB}$ decreases the $V_{Teff}$, and a negative $V_{SB}$ increases the $V_{Teff}$.

In general, the present invention overcomes the problem relating to supply voltage variation by constantly monitoring the $V_{Teff}$ of a transistor and dynamically adjusting the $V_{Teff}$ to a value that improves the transistor performance in light of the actual value of the supply voltage $V_{CC}$ that is received by the integrated circuit. The problem relating to fabrication process variation is overcome by constantly monitoring the $V_{Teff}$ of a transistor and dynamically adjusting the $V_{Teff}$ to a value that is closer to the specified $V_T$.

Figure 1:
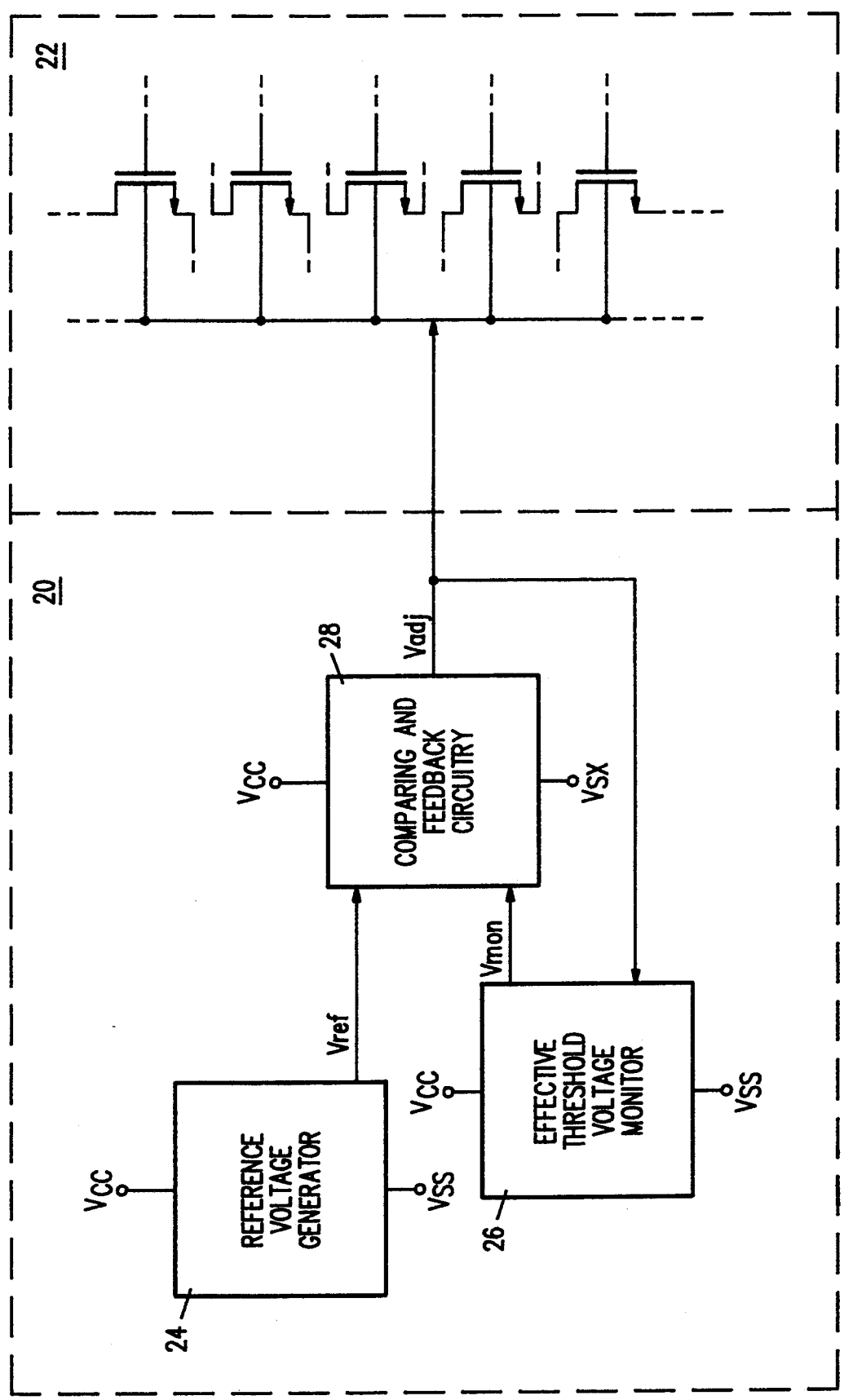
FIG. 1 is a block diagram illustrating a threshold voltage adjusting apparatus in accordance with a first embodiment of the present invention.

FIG. 1 illustrates a threshold voltage adjusting apparatus 20 in accordance with a first embodiment of the present invention that is used for overcoming the problem relating to supply voltage variation. The apparatus 20 may be used to adjust the $V_{Teff}$ of several hundreds or thousands of MOS transistors 22. The $V_{Teff}$s of the transistors 22 are adjusted by varying the potential applied to the body of each transistor 22, which, in turn, varies the $V_{SB}$ of each transistor 22. The $V_{Teff}$ is adjusted to a value that will improve transistor performance in light of the actual value of the supply voltage $V_{CC}$ that is received by the transistors.

The apparatus 20 includes a reference voltage generator 24, an effective threshold voltage monitor 26, and comparing and feedback circuitry 28. These components function together to determine a desirable value of $V_{Teff}$ in light of the actual value of the supply voltage $V_{CC}$, the present value of $V_{Teff}$ of the transistors 22, and whether a positive or negative potential should be applied to the body of the transistors 22 in order to achieve the desirable value of $V_{Teff}$. In the embodiment shown in FIG. 1, the transistors 22 are n-channel MOS transistors.

The reference voltage generator 24 receives the supply voltage $V_{CC}$ and determines a desirable value of $V_{Teff}$, a quantity referred to herein as the "desired effective threshold voltage $V_{Tdes}$", in light of the actual value of $V_{CC}$. After this determination is made, the reference voltage generator 24 generates a reference (or first) voltage signal $V_{ref}$ which may or may not be equal to $V_{Tdes}$. Specifically, when the transistors 22 are n-channel MOS transistors, as is the case with the embodiment shown in FIG. 1, $V_{ref}$ will be approximately equal to $V_{Tdes}$. However, as will be discussed below, when the transistors 22 are p-channel MOS transistors, $V_{ref}$ will normally be approximately equal to the difference between the supply voltage $V_{CC}$ and $V_{Tdes}$.

The reference voltage generator 24 determines $V_{Tdes}$ in light of the actual value of $V_{CC}$. If the actual value of $V_{CC}$ is lower than is called for in the specifications and the present value of $V_{Teff}$ is too high, then the transistors 22 may not be capable of switching on; therefore, the reference voltage generator 24 determines a value of $V_{Tdes}$, which will usually be smaller than $V_T$, that ensures that the transistors 22 will be capable of switching on for the low value of $V_{CC}$. On the other hand, if the actual value of $V_{CC}$ is higher than is called for in the specifications and the present value of $V_{Teff}$ is too low, then current leakage may be excessive; therefore, the reference voltage generator 24 determines a value of $V_{Tdes}$, which will usually be greater than $V_T$, that reduces current leakage when the transistors 22 are switched off.

It will be recognized from the above analysis that $V_{Tdes}$ is small for small values of $V_{CC}$ and that $V_{Tdes}$ is large for large values of $V_{CC}$. Thus, the reference voltage generator 24 determines $V_{Tdes}$ by making it equal to a fraction of the actual value of $V_{CC}$. A voltage divider circuit is used equate $V_{Tdes}$ to a fraction of $V_{CC}$, which will be discussed in detail below with reference made to FIG. 2. In addition, it should be understood that, while the present embodiment of the invention determines $V_{Tdes}$ by making it equal to a fraction of $V_{CC}$, it is envisioned that $V_{Tdes}$ may also be determined independently of $V_{CC}$. For example, $V_{Tdes}$ may remain constant while $V_{CC}$ varies.

The reference voltage signal $V_{ref}$ that is generated by the reference voltage generator 24 is received by the comparing and feedback circuitry 28. In the embodiment shown in FIG. 1, $V_{ref}$ is equal to $V_{Tdes}$.

The effective threshold voltage monitor 26 measures the present value of $V_{Teff}$ of the transistors 22 and generates a monitor (or second) voltage signal $V_{mon}$ in response to the measurement. The monitor voltage signal $V_{mon}$, which is also received by the comparing and feedback circuitry 28, may or may not be equal to the present value of $V_{Teff}$. Specifically, when the transistors 22 are n-channel MOS transistors, as is the case with the embodiment shown in FIG. 1, $V_{mon}$ will be approximately equal to the present value of $V_{Teff}$. However, as will be discussed below, when the transistors 22 are p-channel MOS transistors, $V_{mon}$ will normally be approximately equal to the difference between the supply voltage $V_{CC}$ and the present value of $V_{Teff}$.

As will be discussed in more detail below with reference to FIG. 2, the effective threshold voltage monitor 26 measures the $V_{Teff}$ of the transistors 22 by using one of the transistors 22 as a sample and measuring its $V_{Teff}$.

The comparing and feedback circuitry 28 determines whether a positive or negative adjusting potential $V_{adj}$ should be applied to the body of the transistors 22 in order to achieve the $V_{Tdes}$, and it applies such potential $V_{adj}$ in response to the determination. This determination is made by comparing the reference voltage signal $V_{ref}$ and the monitor voltage signal $V_{mon}$ to each other.

When the transistors 22 are n-channel MOS transistors, as is the case with the embodiment shown in FIG. 1, $V_{mon}$ is equal to the present value of $V_{Teff}$ and $V_{ref}$ is equal to $V_{Tdes}$. If $V_{mon}$ has a greater potential than $V_{ref}$, then the present value of $V_{Teff}$ is larger than $V_{Tdes}$. In this scenario, $V_{Teff}$ must be decreased, and the comparing and feedback circuitry 28 applies a positive $V_{adj}$ to the body of each of the transistors 22 in order to create a negative source-body voltage $v_{SB}$. If $V_{mon}$ has a smaller potential than $V_{ref}$, then the present value of $V_{Teff}$ is smaller than $V_{Tdes}$. In this scenario, $V_{Teff}$ must be increased, and the comparing and feedback circuitry 28 applies a negative $V_{adj}$ to the body of each of the transistors 22 in order to create a positive source-body voltage $V_{SB}$.

The adjusting potential $V_{adj}$ is also fed back to the effective threshold voltage monitor 26. The $V_{adj}$ signal is used to adjust the $V_{Teff}$ of the transistor that is used as a sample by the effective threshold voltage monitor 26 in measuring the present value of the $V_{Teff}$ of the transistors 22. Thus, the $V_{Teff}$ of the sample transistor is updated in the same manner as the transistors 22. This feedback loop facilitates the constant monitoring of the present value of $V_{Teff}$ of the transistors 22.

Figure 2:
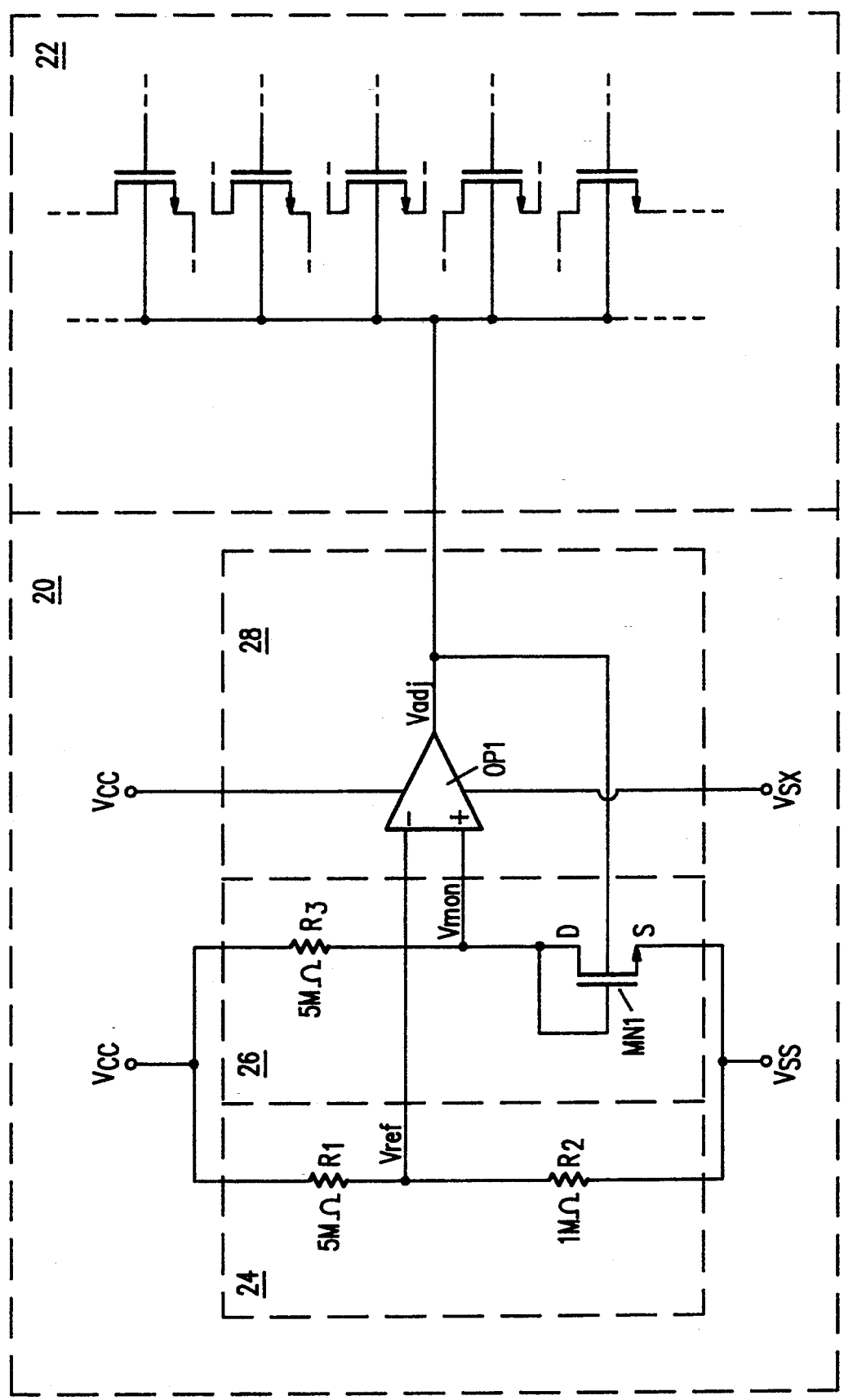
FIG. 2 is a schematic diagram illustrating the threshold voltage adjusting apparatus shown in Figure 1.

FIG. 2 illustrates the circuitry used to implement the apparatus 20 shown in FIG. 1. The reference voltage generator 24 includes a voltage divider circuit made up of series-connected resistors R1 and R2. Resistors R1 and R2 preferably have values of 5 MΩ and 1 MΩ, respectively. The resistors R1 and R2 are connected between the supply voltage $V_{CC}$ and another supply voltage $V_{SS}$.

The supply voltage $V_{SS}$ has a lower potential than $V_{CC}$. It will be assumed for purposes of analysis herein that $V_{SS}$ is equal to ground potential; therefore, the "supply voltage" applied to the reference voltage generator 24 and the effective threshold voltage monitor 26 is the value of $V_{CC}$. If $V_{SS}$ is equal to other than ground potential, the "supply voltage" applied to the reference voltage generator 24 and the effective threshold voltage monitor 26 is the potential difference between $V_{CC}$ and $V_{SS}$.

As discussed above, the reference voltage generator 24 determines the value of $V_{Tdes}$, and that value of $V_{Tdes}$ is a fraction of $V_{CC}$. It is believed that an ideal value of $V_{Tdes}$ is approximately 15% of $V_{CC}$; however, it should be well understood that this percentage may not be ideal for many circuit applications and that this invention is intended to include other situations where modifications of this percentage produce more efficient results.

As explained above, when the transistors 22 are n-channel MOS transistors, $V_{ref}$ will be approximately equal to $V_{Tdes}$. It follows that:

$$V_{ref} = V_{Tdes}$$
$$= .15 V_{CC}$$
$$= V_{CC}(R2/(R1 + R2))$$

Plugging the values for R1 and R2 into this equation, it follows that:

$$V_{ref} = V_{CC}(1\ M\Omega/(5\ M\Omega + 1\ M\Omega))$$
$$= .166 V_{CC}$$

Thus, the voltage divider circuit made up of resistors R1 and R2 generates a value of $V_{ref}$ that is approximately equal to 15% of $V_{CC}$.

The effective threshold voltage monitor 26 includes an n-channel MOS transistor MN1 having its gate connected to its drain and a resistor R3 connected in series with the drain of transistor MN1. The resistor R3 preferably has a value of 5 M$\Omega$. The resistor R3 and transistor MN1 are connected in series between $V_{CC}$ and $V_{SS}$.

The effective threshold voltage monitor 26 measures the present value of $V_{Teff}$ of the transistors 22 by measuring the present value of $V_{Teff}$ of transistor MN1. Transistor MN1 is a sample of one of the transistors 22. As will be discussed below, the present value of $V_{Teff}$ of transistor MN1 may be representative of the $V_{Teff}$ of each of the transistors 22 or only an approximation of the $V_{Teff}$ of each of the transistors 22.

The present value of $V_{Teff}$ is measured by measuring $V_{GS}$. Specifically, because transistor MN1 has its gate connected to its drain, the gate-source voltage $V_{GS}$ is equal to its drain-source voltage $V_{DS}$. It follows that $V_{GS}$ is equal to the difference between $V_{CC}$ and the voltage drop across resistor R3 ($V_{R3}$). Therefore, the present value of $V_{Teff}$ of transistor MN1 is equal to $V_{GS}$ when approximately 1.0 micro-ampere of current flows from the drain to source.

As discussed above, the effective threshold voltage monitor 26 also generates a monitor (or second) voltage signal $V_{mon}$ in response to the measurement. $V_{mon}$ is generated at the drain of MN1, i.e., $V_{mon}$ is the potential difference between the drain and $V_{SS}$. $V_{mon}$, which is received by the comparing and feedback circuitry 28, may or may not be equal to the present value of $V_{Teff}$. For the embodiment shown in FIG. 2, which adjusts the $V_{Teff}$ of n-channel MOS transistors, $V_{mon}$ is equal to $V_{GS}$ which is equal to $V_{Teff}$ when approximately 1.0 micro-ampere of current flows from drain to source.

The comparing and feedback circuitry 28 includes an operational amplifier OP1. The op-amp OP1 compares $V_{ref}$ to $V_{mon}$ by receiving $V_{ref}$ at its inverting input and $V_{mon}$ at its non-inverting input. In general, op-amp OP1 and its feed-back loop to the body of transistor MN1 dynamically adjust the $V_{Teff}$ of transistor MN1 until the voltage at the node between resistors R1 and R2 ($V_{ref}$) is equal to the voltage at the drain of transistor MN1 ($V_{mon}$).

Specifically, when $V_{mon}$ has a greater potential than $V_{ref}$, i.e., $V_{Teff} > V_{Tdes}$, then op-amp OP1 generates a positive adjustment voltage signal $V_{adj}$ which is applied to the bodies of transistors 22, as well as the body of transistor MN1. The positive $V_{adj}$ causes a negative $V_{SB}$ which causes the $V_{ref}$ to decrease. When $V_{mon}$ has a smaller potential than $V_{ref}$, i.e., $V_{Teff} < V_{Tdes}$, then op-amp OP1 generates a negative adjustment voltage signal $V_{adj}$ which is applied to the bodies of transistors 22, as well as the body of transistor MN1. The negative $V_{adj}$ causes a positive $V_{SB}$ which causes the $V_{Teff}$ to increase.

As the $V_{Teff}$ of transistor MN1 is adjusted, it is brought closer to $V_{Tdes}$. The comparing and feedback circuitry 28 continues to compare $V_{ref}$ to $V_{mon}$ and feedback $V_{adj}$ to adjust $V_{Teff}$ of transistor MN1. Eventually, $V_{Teff}$ is made equal to $V_{Tdes}$, and the performance of the transistors 22 is improved.

The op-amp OP1 is supplied with two different supply voltages $V_{CC}$ and $V_{SX}$. The supply voltage $V_{SX}$ has a lower potential than $V_{SS}$. The op-amp OP1 must receive a voltage supply having a lower potential than $V_{SS}$ in order to create a positive $V_{SB}$. As explained above, it was assumed for purposes of analysis herein that $V_{SS}$ is equal to ground potential. The source of transistor MN1 is connected to $V_{SS}$. In order to create a positive $V_{SB}$, a negative $V_{adj}$ having a potential that is lower than $V_{SS}$ must be applied to the body of transistor MN1. In order for op-amp OP1 to generate such a negative $V_{adj}$, it must be supplied with a supply voltage having this potential, namely, $V_{SX}$. The supply voltage $V_{SX}$ may be generated by a standard charge pump bias generator.

Summarizing the embodiment of the invention shown in FIG. 2, the reference voltage generator 24, which comprises a voltage divider circuit made up of resistors R1 and R2, generates the reference voltage signal $V_{ref}$, which in the case of n-channel MOS transistors 22, is equal to the desired effective threshold voltage $V_{Tdes}$. The effective threshold voltage monitor 26 measures the present value of $V_{Teff}$ of transistor MN1 and generates the monitor voltage signal $V_{mon}$, which in the case of n-channel MOS transistors 22, is equal to the present value of $V_{Teff}$. The comparing and feedback circuitry 28, comprising the op-amp OP1, compares $V_{ref}$ (equal to $V_{Tdes}$) to $V_{mon}$ (equal to $V_{Teff}$) and applies either a positive or negative $V_{adj}$ to the body of transistor MN1, as well as each of the transistors 22, in order to adjust $V_{Teff}$ to be equal to $V_{Tdes}$.

It was mentioned above that the $V_{Teff}$ of each of the hundreds or thousands of transistors 22 is adjusted by applying $V_{adj}$ to the body of each of the transistors 22 in order to adjust the source-body voltage $V_{SB}$. In an integrated circuit, $V_{adj}$ is applied to the body of a transistor by applying $V_{adj}$ to the silicon tub in which many transistors are formed. Thus, by applying $V_{adj}$ to a single silicon tub, it is applied to the body of many transistors.

It was also mentioned above that transistor MN1 is a sample of one of the transistors 22 and that the present value of $V_{Teff}$ of transistor MN1 may be representative of the $V_{Teff}$ of each of the transistors 22 or only an approximation of the $V_{Teff}$ of each of the transistors 22. It should be understood that transistor MN1 may or may not be matched to all or any of the transistors 22. If transistor MN1 is matched to all of the transistors 22, then transistor MN1's $V_{Teff}$ will be the same as the $V_{Teff}$ of each one of the transistors 22. On the other hand, if transistor MN1 is not matched to all of the transistors 22, then transistor MN1's $V_{Teff}$ will most likely be slightly different than the unmatched transistors 22. Even though some, or even most, of the transistors 22 are not matched to transistor MN1, a single threshold voltage adjusting apparatus 20 may be used to accurately adjust the $V_T$, of all of the transistors 22.

Figure 3:
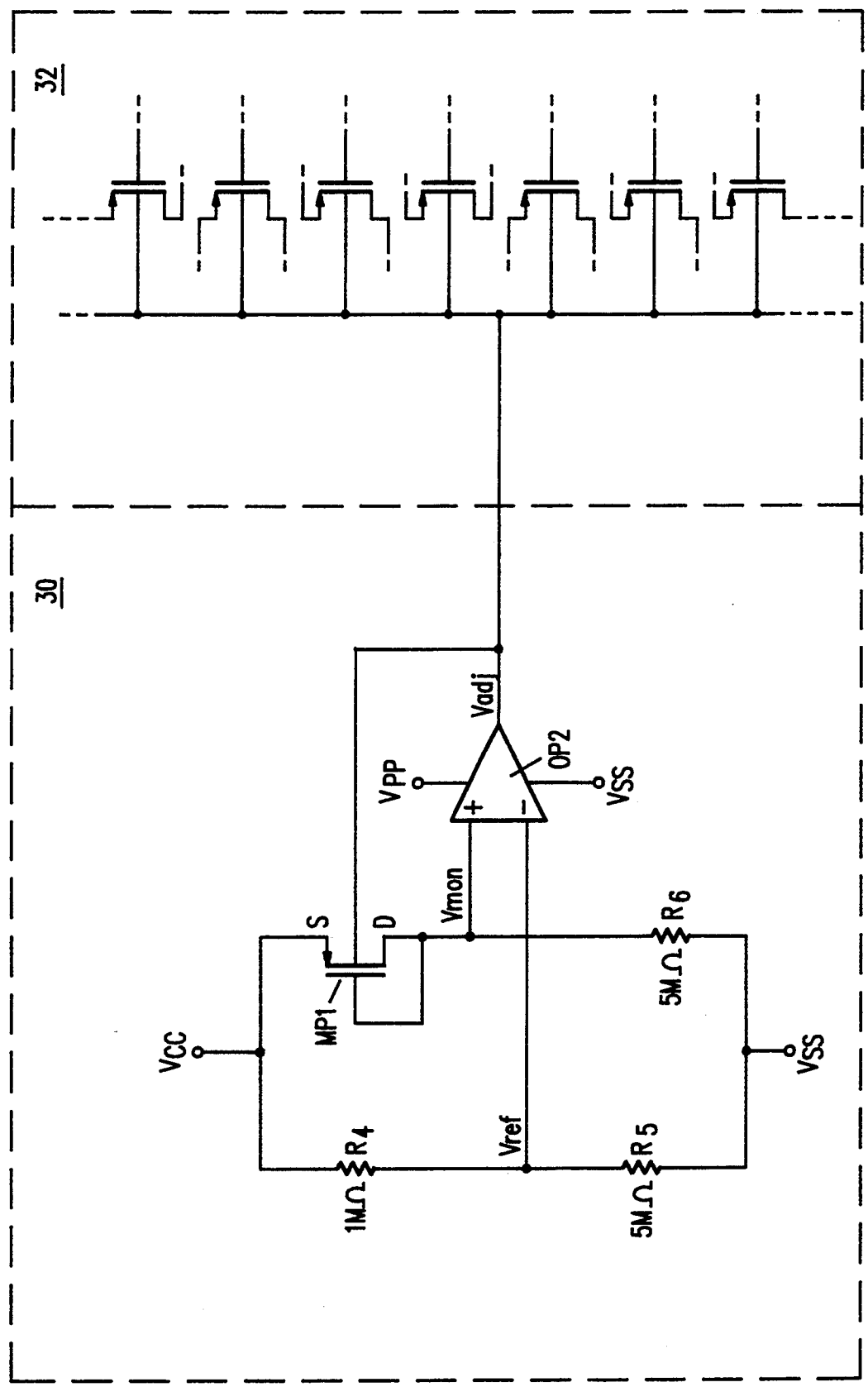
FIG. 3 is a schematic diagram illustrating a threshold voltage adjusting apparatus in accordance with a second embodiment of the present invention.

FIG. 3 illustrates another embodiment of the present invention for use in overcoming the problem relating to supply voltage $V_{CC}$ variation. The apparatus 30 is used to adjust the $V_{Teff}$ of each of several hundreds or thousands of p-channel MOS transistors 32 to a value that will enhance transistor performance for the actual value of $V_{CC}$ that is received by the circuit.

The apparatus 30 is very similar in construction and operation to the apparatus 20. Specifically, a voltage divider circuit made up of two resistors R4 and R5 having values of 1 M and 5 M, respectively, is used to generate $V_{ref}$. A p-channel transistor MP1 having its gate connected to its drain is connected in series with another resistor R6 having a value of 5 MΩ. The signal $V_{mon}$ is generated at the drain of transistor MP1. An operational amplifier OP2 receives $V_{ref}$ at its inverting input and $V_{mon}$ at its non-inverting input. $V_{ref}$ and $V_{mon}$ are compared to each other and an adjustment voltage signal $V_{adj}$ is applied to the body of each of the transistors 32, as well as the body of transistor MP1, to adjust $V_{Teff}$ to $V_{Tdes}$.

As eluded to above, however, there are differences between the operation of the apparatus 30 and the apparatus 20 that stem from the substitution of the p-channel transistors 32 and MP1 for the n-channel transistors 22 and MN1. The reader will recall that for a p-channel enhancement-mode MOS transistor, the gate-source voltage $V_{GS}$ must be negative in order to induce a channel. Current will flow only when $V_{GS}$ falls below a negative $V_T$, or, in other words, when $V_{SG}$ exceeds a positive $V_T$. Furthermore, in a p-channel MOS transistor, a positive source-body voltage $V_{SB}$ decreases the $V_{Teff}$, and a negative source-body voltage $V_{SB}$ increases the $V_{Teff}$.

Because the polarities of a p-channel MOS transistor are backwards from an n-channel MOS transistor, transistor MP1 has its source connected to $V_{CC}$ rather than $V_{SS}$. This orientation of transistor MP1 results in $V_{mon}$, which is generated at the drain of MP1, being equal to the voltage across resistor R6 ($V_{R6}$), rather than $v_{GS}$ of transistor MP1. Thus, when approximately 1.0 microampere of current flows through transistor MP1, $V_{Teff}$ is equal to $V_{SG}$, and $V_{mon}$ is equal to $V_{R6}$ or the difference between $V_{CC}$ and $V_{Teff}$; $V_{mon}$ is not simply equal to $V_{Teff}$ as in the apparatus of FIG. 2.

Additionally, $V_{ref}$ is not simply equal to $V_{Tdes}$ as in the apparatus of FIG. 2. The function of op-amp OP2 is to dynamically adjust $V_{Teff}$ of transistor MP1 until it is equal to $V_{Tdes}$. The op-amp OP2 executes this function by adjusting $V_{Teff}$ until $V_{ref}$ is equal to $V_{mon}$. If $V_{ref}$ were equal to $V_{Tdes}$, then $V_{mon}$ would eventually equal $V_{Tdes}$, which would result in $V_{R6}$ being equal to $V_{Tdes}$, rather than $V_{SG}$ of transistor MP1.

Therefore, in order for $V_{SG}$ to eventually equal $V_{Tdes}$, $V_{mon}$ must be made to equal the difference between $V_{CC}$ and $V_{Tdes}$. $V_{mon}$ will eventually equal the difference between $V_{CC}$ and $V_{Tdes}$ if $V_{ref}$ is initially made equal to the difference between $V_{CC}$ and $V_{Tdes}$. If $V_{Tdes}$ is chosen to be approximately 15% of $V_{CC}$, then it follows that:

$$V_{ref} = V_{CC} - V_{Tdes}$$
$$= V_{CC} - .15V_{CC}$$
$$= .85V_{CC}$$

Plugging in the values for resistors R4 and R5:

$$V_{ref} = V_{CC}(R5/(R4 + R5))$$
$$= V_{CC}(5\ M\Omega/(1\ M\Omega + 5\ M\Omega))$$
$$= .833 V_{CC}$$

Thus, $V_{ref}$ is approximately equal to 85% of $V_{CC}$.

It may be said that $V_{Teff}$ of transistor MP1 is adjusted to $V_{Tdes}$ "indirectly" by op-amp OP2 causing $V_{R5}$ and $V_{R6}$ to be made equal. If the present value of $V_{Teff}$ is greater than $V_{Tdes}$, then $V_{mon}$ will be smaller than $V_{ref}$. Op-amp OP2 will generate a negative adjustment voltage signal $V_{adj}$ and apply it to the body of transistor MP1. The negative $V_{adj}$ will create a positive $v_{SB}$ which will cause the $V_{Teff}$ to decrease. On the other hand, if the present value of $V_{Teff}$ is smaller than $V_{Tdes}$, then $V_{mon}$ will be greater than $V_{ref}$. Op-amp OP2 will generate a positive adjustment voltage signal $V_{adj}$ and apply it to the body of transistor MP1. The positive $V_{adj}$ will create a negative $v_{SB}$ which will cause the $V_{Teff}$ to increase.

Another difference between the apparatus 30 and the apparatus 20 is that the op-amp OP2 requires supply voltages $V_{pp}$ and $V_{SS}$ for operation rather than $V_{CC}$ and $V_{SX}$. The supply voltage $V_{pp}$ has a higher potential than $V_{CC}$. The op-amp OP2 requires a voltage supply having a higher potential than $V_{CC}$ in order to create a negative $v_{SB}$. This requirement is a result of the source of transistor MP1 being connected to $V_{CC}$. In order to create a negative $v_{SB}$, a positive $V_{adj}$ having a potential that is higher than $V_{CC}$ must be applied to the body of transistor MP1. In order for op-amp OP2 to generate such a positive $V_{adj}$, it must be supplied with a supply voltage having this potential, namely, $V_{pp}$. The supply voltage $V_{pp}$ may be generated by a standard charge pump bias generator.

Summarizing the embodiment of the invention shown in FIG. 3, the operation of the threshold voltage adjusting apparatus 30 is similar to the operation of the threshold voltage adjusting apparatus 20, but there are some differences. Because of the reversed polarities of the p-channel transistor MP1, the source will normally be tied to $V_{CC}$. In order to accommodate the orientation of transistor MP1, $V_{ref}$ must be equal to the difference between $V_{CC}$ and $V_{Tdes}$, rather than simply $V_{Tdes}$, so that $V_{mon}$ will eventually be equal to the difference between $V_{CC}$ and $V_{Teff}$.

Figure 4:
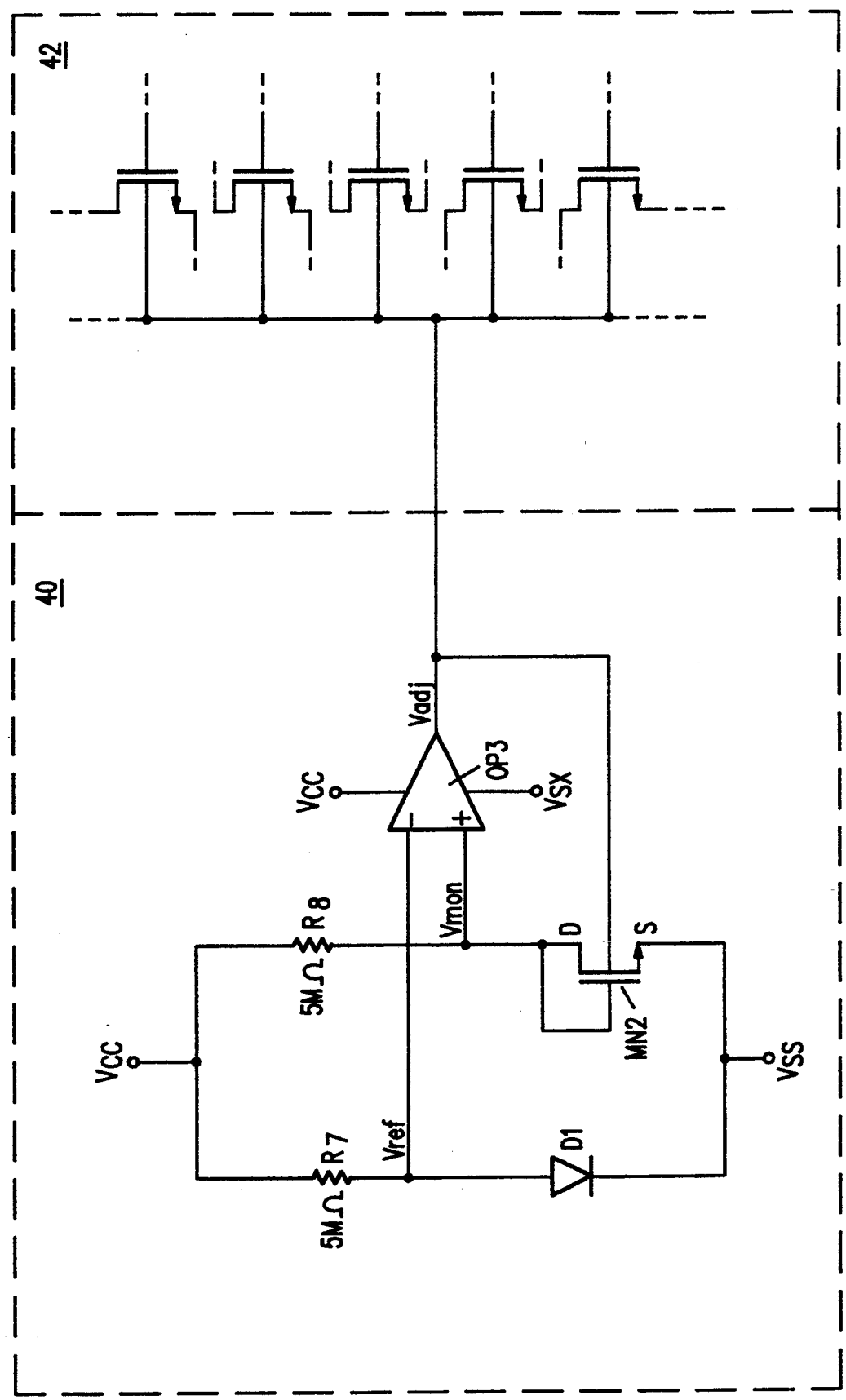
FIG. 4 is a schematic diagram illustrating a threshold voltage adjusting apparatus in accordance with a third embodiment of the present invention.

FIG. 4 illustrates an embodiment of the present invention for use in overcoming the problem relating to fabrication process variations and inconsistencies. The threshold voltage adjusting apparatus 40 is used to adjust the $V_{Teff}$ of several hundreds or thousands of n-channel MOS transistors 42.

For purposes of analysis herein, it will be assumed that the supply voltage $V_{CC}$ does not vary significantly from its specified value. As explained above, even if the supply voltage $V_{CC}$ does not vary from its specified value, if $V_T$ cannot be accurately set during the fabrication process, current leakage or inability of the transistor to switch on can occur. In other words, if $V_T$ comes out at the low end of the specifications, then current leakage may be a problem, and if $V_T$ comes out at the high end of the specifications, then $V_{GS}$ may be unable to reach $V_T$.

In general, the apparatus 40 overcomes these problems by constantly monitoring the $V_{Teff}$ of the transistor MN2 and dynamically adjusting the $V_{Teff}$ to a value that is closer to the specified $V_T$. By insuring that $V_{Teff}$ will be closer to the specified $V_T$, transistor performance will improve. Furthermore, other fabrication process specifications can be modified to further improve performance. For example, because of the more tightly controlled $V_{Teff}$, the effective channel length $L_{eff}$ can be reduced which will permit a higher average drive current.

The only difference between the apparatus 40 of FIG. 4 and the apparatus 20 of FIG. 2 is that the resistor R2 is replaced with a diode D1; otherwise, the operation of the two apparatus 20 and 40 is identical. Thus, in the apparatus 40, $V_{ref}$ is equal to the voltage across the diode D1 instead of the resistor R2. Because transistor MN2 is an n-channel transistor, $V_{ref}$ is equal to $V_{Tdes}$. Therefore, $V_{Tdes}$ is equal to the voltage across the diode D1.

It is believed that the voltage across a diode is similar to a desirable $V_T$ for MOS transistors that are used in CMOS logic circuits. It should be well understood, however, that a diode is just one example of a circuit element or elements that may be used to set a predetermined voltage drop that will be used to set $V_{Tdes}$. It should also be well understood that, when the apparatus is implemented in silicon, a diode-connected bipolar transistor may be used as the diode D1.

It should be noted that because the voltage across a diode remains relatively constant, $V_{Tdes}$, i.e., $V_{D1}$, will remain relatively constant even when there are variations in $V_{CC}$.

Figure 5:
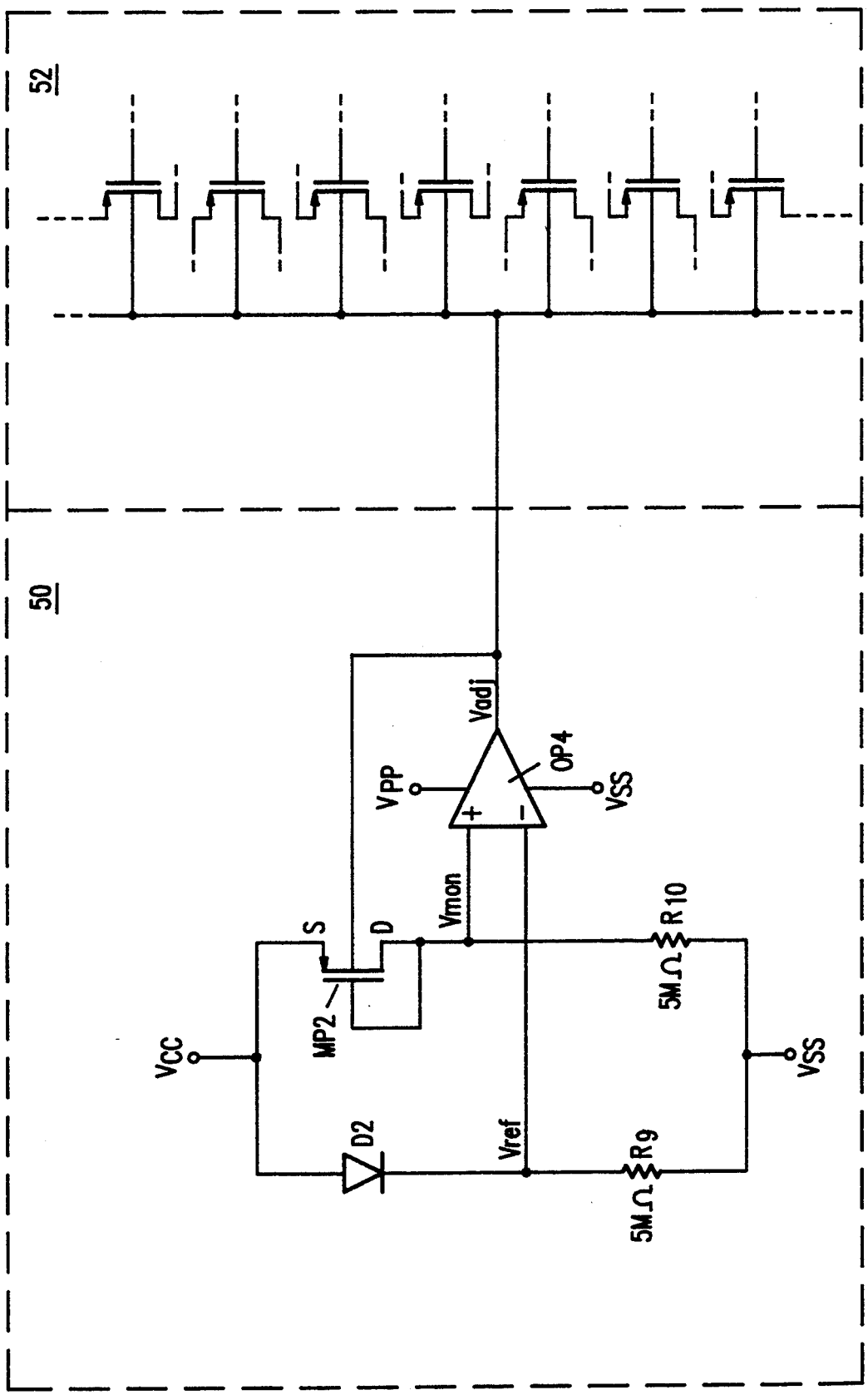
FIG. 5 is a schematic diagram illustrating a threshold voltage adjusting apparatus in accordance with a fourth embodiment of the present invention.

FIG. 5 illustrates another embodiment of the present invention for use in overcoming the problem relating to fabrication process variations and inconsistencies. The threshold voltage adjusting apparatus 50 is used to adjust the $V_{Teff}$ of several hundreds or thousands of p-channel MOS transistors 52.

The construction and operation of the apparatus 50 shown in FIG. 5 is identical to the apparatus 30 shown in FIG. 3, except for the substitution of a diode D2 for the resistor R4. Thus, the apparatus 50 causes the $V_{Teff}$ of the p-channel transistor MP2 to be adjusted to the voltage across diode D2 ($V_{D2}$).

Another aspect of the present invention is a method of adjusting the $V_{Teff}$ of a MOS transistor to a $V_{Tdes}$. First, in the case of an n-channel transistor, a first voltage signal is generated that has a voltage approximately equal to the desired effective threshold voltage. In the case of a p-channel transistor, the first voltage signal has a voltage approximately equal to the difference between a supply voltage and the desired effective threshold voltage. Next, the effective threshold voltage of the MOS transistor is measured.

A second voltage signal having a voltage approximately equal to the measured effective threshold voltage is then generated. In the case of a p-channel transistor, the second voltage signal is approximately equal to the difference between the supply voltage and the measured effective threshold voltage. The first voltage signal is then compared to the second voltage signal. The effective threshold voltage of the MOS transistor is adjusted so that the second voltage signal is substantially equal to the first voltage signal. Normally, the effective threshold voltage is adjusted by varying the source-body voltage potential of the MOS transistor.

It should be understood that various alternatives to the embodiments of the invention described herein may be employed in practicing the invention. It is intended that the following claims define the scope of the invention and that structures and methods within the scope of these claims and their equivalents be covered thereby.

What is claimed is:

1. An apparatus for adjusting the effective threshold voltage of a MOS transistor, comprising:
   reference voltage generation circuitry for generating a first voltage signal;
   threshold voltage monitoring circuitry that includes the MOS transistor for measuring variations in a gate-source voltage measured between the gate and source of the MOS transistor and for generating a second voltage signal having a linear mathematical relationship with the gate-source voltage; and
   feedback circuitry for comparing the first voltage signal to the second voltage signal and for adjusting the effective threshold voltage of the MOS transistor so that the first voltage signal is substantially equal to the second voltage signal.

2. An apparatus according to claim 1, wherein:
   the first voltage signal has a voltage equal to a first fraction of a supply voltage; and
   the second voltage signal has a voltage equal to a second fraction of the supply voltage.

3. An apparatus according to claim 1, wherein the reference voltage generation circuitry comprises:
   a voltage divider circuit connected between a supply voltage and a node having a lower potential than the supply voltage.

4. An apparatus according to claim 3, wherein the voltage divider circuit comprises:
   two series connected resistors;
   wherein the first voltage signal is generated at a node where the two resistors are connected together.

5. An apparatus according to claim 3, wherein the voltage divider circuit comprises:
   a diode; and
   a resistor connected in series with the diode;
   wherein the first voltage signal is generated at a node where the diode is connected to the resistor.

6. An apparatus according to claim 1, wherein the threshold voltage monitoring circuitry comprises:
   a resistor connected in series with the drain of the MOS transistor; and
   wherein the MOS transistor has its gate connected to its drain.

7. An apparatus according to claim 6, wherein:
   the series connected MOS transistor and the resistor are connected between a voltage supply and a node having a lower potential than the voltage supply; and
   the second voltage signal is generated at the drain of the MOS transistor.

8. An apparatus according to claim 7, wherein the MOS transistor is an n-channel MOS transistor.

9. An apparatus according to claim 7, wherein the MOS transistor is an p-channel MOS transistor.

10. An apparatus according to claim 1, wherein the feedback circuitry comprises:
    an operational amplifier that receives the first voltage signal at its inverting input and the second voltage signal at its noninverting input; and
    wherein the output of the operational amplifier is used to adjust the effective threshold voltage of the MOS transistor.

11. An apparatus according to claim 10, wherein the output of the operational amplifier is connected to the body of the MOS transistor.

12. An apparatus according to claim 1, wherein the feedback circuitry is used to adjust the effective threshold voltage of each of a plurality of MOS transistors.

13. An apparatus according to claim 12, wherein the source-body voltage potential of each one of the plurality of MOS transistors is adjusted by the feedback circuitry.

14. An apparatus for adjusting the effective threshold voltage of a MOS transistor to a desired effective threshold voltage, comprising:
reference voltage generation circuitry for generating a first voltage signal having a voltage approximately equal to the desired effective threshold voltage;
threshold voltage monitoring circuitry that includes the MOS transistor for measuring the effective threshold voltage of the MOS transistor and for generating a second voltage signal having a voltage approximately equal to the measured effective threshold voltage of the MOS transistor; and
feedback circuitry for comparing the first voltage signal to the second voltage signal and for adjusting the effective threshold voltage of the MOS transistor so that the second voltage signal is substantially equal to the first voltage signal.

15. An apparatus according to claim 14, wherein the reference voltage generation circuitry comprises:
two series connected resistors connected between a supply voltage and a node having a lower potential than the supply voltage; and
wherein the first voltage signal is generated at a node where the two resistors are connected together.

16. An apparatus according to claim 14, wherein the reference voltage generation circuitry comprises:
a diode;
a resistor connected in series with the diode; and
wherein the series connected resistor and diode are connected between a supply voltage and a node having a lower potential than the supply voltage and the first voltage signal is generated at a node where the diode is connected to the resistor.

17. An apparatus according to claim 14, wherein the threshold voltage monitoring circuitry comprises:
a resistor having one terminal connected to the drain of the MOS transistor and the other terminal connected to a voltage supply; and
wherein the MOS transistor has its gate connected to its drain and its source connected to a node having a lower potential than the voltage-supply, the second voltage signal being generated at the drain of the MOS transistor.

18. An apparatus according to claim 17, wherein the MOS transistor is an n-channel MOS transistor.

19. An apparatus according to claim 14, wherein the feedback circuitry comprises:
an operational amplifier that receives the first voltage signal at its inverting input and the second voltage signal at its noninverting input; and
wherein the output of the operational amplifier is used to adjust the effective threshold voltage of the MOS transistor.

20. An apparatus according to claim 19, wherein the output of the operational amplifier is connected to the body of the MOS transistor.

21. An apparatus according to claim 14, wherein the desired effective threshold voltage is approximately equal to 15% of a supply voltage.

22. An apparatus according to claim 14, wherein the feedback circuitry is used to adjust the effective threshold voltage of each of a plurality of MOS transistors.

23. An apparatus according to claim 22, wherein the source-body voltage potential of each one of the plurality of MOS transistors is adjusted by the feedback circuitry.

24. An apparatus for adjusting the effective threshold voltage of a MOS transistor to a desired effective threshold voltage, comprising:
reference voltage generation circuitry for generating a first voltage signal having a voltage approximately equal to the difference between a supply voltage and the desired effective threshold voltage;
threshold voltage monitoring circuitry that includes the MOS transistor for measuring the effective threshold voltage of the MOS transistor and for generating a second voltage signal having a voltage approximately equal to the difference between the supply voltage and the measured effective threshold voltage of the MOS transistor; and
feedback circuitry for comparing the first voltage signal to the second voltage signal and for adjusting the effective threshold voltage of the MOS transistor so that the second voltage signal is substantially equal to the first voltage signal.

25. An apparatus according to claim 24, wherein the reference voltage generation circuitry comprises:
two series connected resistors connected between the supply voltage and a node having a lower potential than the supply voltage; and
wherein the first voltage signal is generated at a node where the two resistors are connected together.

26. An apparatus according to claim 24, wherein the reference voltage generation circuitry comprises:
a diode;
a resistor connected in series with the diode; and
wherein the series connected resistor and diode are connected between the supply voltage and a node having a lower potential than the supply voltage and the first voltage signal is generated at a node where the diode is connected to the resistor.

27. An apparatus according to claim 24, wherein the threshold voltage monitoring circuitry comprises:
a resistor having one terminal connected to the drain of the MOS transistor; and
wherein the MOS transistor has its gate connected to its drain and its source connected to the supply voltage, the other terminal of the resistor being connected to a node having a lower potential than the supply voltage, the second voltage signal being generated at the drain of the MOS transistor.

28. An apparatus according to claim 27, wherein the MOS transistor is a p-channel MOS transistor.

29. An apparatus according to claim 24, wherein the feedback circuitry comprises:
an operational amplifier that receives the first voltage signal at its inverting input and the second voltage signal at its noninverting input; and
wherein the output of the operational amplifier is used to adjust the effective threshold voltage of the MOS transistor.

30. An apparatus according to claim 29, wherein the output of the operational amplifier is connected to the body of the MOS transistor.

31. An apparatus according to claim 24, wherein the desired effective threshold voltage is approximately equal to 15% of the supply voltage.

32. An apparatus according to claim 24, wherein the feedback circuitry is used to adjust the effective threshold voltage of each of a plurality of MOS transistors.

33. An apparatus according to claim 32, wherein the source-body voltage potential of each one of the plurality of MOS transistors is adjusted by the feedback circuitry.

34. A method of adjusting the effective threshold voltage of a MOS transistor to a desired effective threshold voltage, the method comprising the steps of:
generating a first voltage signal having a voltage approximately equal to the desired effective threshold voltage;
measuring the effective threshold voltage of the MOS transistor;
generating a second voltage signal having a voltage approximately equal to the measured effective threshold voltage of the MOS transistor;
comparing the first voltage signal to the second voltage signal; and
adjusting the effective threshold voltage of the MOS transistor so that the second voltage signal is substantially equal to the first voltage signal.

35. A method according to claim 34, wherein the adjusting step is accomplished by varying the source-body voltage potential of the MOS transistor.

36. A method according to claim 34, wherein the adjusting step further comprises the step of adjusting the effective threshold voltage of a plurality of MOS transistors.

37. A method of adjusting the effective threshold voltage of a MOS transistor to a desired effective threshold voltage, the method comprising the steps of:
generating a first voltage signal having a voltage approximately equal to the difference between a supply voltage and the desired effective threshold voltage;
measuring the effective threshold voltage of the MOS transistor;
generating a second voltage signal having a voltage approximately equal to the difference between the supply voltage and the measured effective threshold voltage of the MOS transistor;
comparing the first voltage signal to the second voltage signal; and
adjusting the effective threshold voltage of the MOS transistor so that the second voltage signal is substantially equal to the first voltage signal.

38. A method according to claim 37, wherein the adjusting step is accomplished by varying the source-body voltage potential of the MOS transistor.

39. A method according to claim 37, wherein the adjusting step further comprises the step of adjusting the effective threshold voltage of a plurality of MOS transistors.

* * * * *